United States Patent
Ainspan et al.

(10) Patent No.: US 8,704,566 B2
(45) Date of Patent: Apr. 22, 2014

(54) HYBRID PHASE-LOCKED LOOP ARCHITECTURES

(75) Inventors: Herschel A. Ainspan, New Hempstead, NY (US); Mark A. Ferriss, Tarrytown, NY (US); Daniel J. Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/608,277

(22) Filed: Sep. 10, 2012

(65) Prior Publication Data
US 2014/0070855 A1 Mar. 13, 2014

(51) Int. Cl.
*H03L 7/06* (2006.01)
(52) U.S. Cl.
USPC .......................... 327/158; 327/149
(58) Field of Classification Search
USPC .................................. 327/149, 158
See application file for complete search history.

(56) References Cited

U.S. PATENT DOCUMENTS

| | | | |
|---|---|---|---|
| 5,978,425 A | 11/1999 | Takla | |
| 6,690,240 B2 | 2/2004 | Maxim et al. | |
| 7,177,611 B2 | 2/2007 | Goldman | |
| 7,292,078 B2 * | 11/2007 | Jung et al. | 327/157 |
| 7,349,514 B2 | 3/2008 | Meltzer et al. | |
| 7,443,251 B2 | 10/2008 | Rylyakov et al. | |
| 7,443,351 B2 | 10/2008 | Komine | |
| 7,580,497 B2 | 8/2009 | Wang et al. | |
| 7,602,255 B1 * | 10/2009 | Lai et al. | 331/16 |
| 7,777,577 B2 | 8/2010 | Jennings et al. | |
| 7,893,788 B2 | 2/2011 | Wang et al. | |
| 8,138,840 B2 | 3/2012 | Ainspan et al. | |
| 8,274,325 B2 * | 9/2012 | Lamanna et al. | 327/553 |
| 8,339,165 B2 * | 12/2012 | Dunworth et al. | 327/152 |
| 8,432,197 B2 * | 4/2013 | Daly et al. | 327/156 |
| 8,432,203 B2 * | 4/2013 | Pialis et al. | 327/156 |
| 8,461,885 B2 * | 6/2013 | Nguyen et al. | 327/156 |
| 8,493,113 B2 * | 7/2013 | Ferriss et al. | 327/156 |
| 8,508,270 B2 * | 8/2013 | Yaghini et al. | 327/159 |
| 8,513,995 B2 * | 8/2013 | Wang et al. | 327/159 |
| 2005/0248413 A1 * | 11/2005 | Zhu et al. | 331/17 |
| 2006/0017476 A1 * | 1/2006 | Jung et al. | 327/156 |

(Continued)

OTHER PUBLICATIONS

A. Sai et al., "A 570fs rms Integrated-Jitter Ring-VCO-Based 1.21GHz PLL with Hybrid Loop," IEEE International Solid-State Circuits Conference (ISSCC), 2011, pp. 98-99a.

(Continued)

*Primary Examiner* — Adam Houston
(74) *Attorney, Agent, or Firm* — Anne V. Dougherty; Ryan, Mason & Lewis, LLP

(57) ABSTRACT

Phase locked loop (PLL) architectures are provided such as hybrid PLL architectures having separate digital integrating control paths and analog proportional control paths. An analog proportional control path can be implemented with a charge pump circuit that includes resistors in series with CMOS switches to generate control currents (e.g., Up/Down control currents) which are used to adjust a control voltage applied to a digitally controlled oscillator. A digital integrating control path can be implemented with a series of sigma-delta modulators that operate at different frequencies to convert higher bit data signals to lower bit data signals along the digital integrating control path. A single phase frequency detector may be implemented to generate control signals that separately control the analog proportional and digital integrating control paths.

16 Claims, 4 Drawing Sheets

(56) References Cited

U.S. PATENT DOCUMENTS

| | | | |
|---|---|---|---|
| 2007/0126512 A1* | 6/2007 | Bellaouar et al. | 331/16 |
| 2009/0085679 A1* | 4/2009 | Jennings et al. | 331/1 A |
| 2011/0133799 A1 | 6/2011 | Dunworth et al. | |
| 2012/0313676 A1* | 12/2012 | Nguyen et al. | 327/156 |
| 2013/0027097 A1* | 1/2013 | Wang et al. | 327/156 |
| 2013/0027099 A1* | 1/2013 | Wang et al. | 327/156 |
| 2013/0027100 A1* | 1/2013 | Yaghini et al. | 327/156 |
| 2013/0063192 A1* | 3/2013 | Ferriss et al. | 327/157 |
| 2013/0076414 A1* | 3/2013 | Kato | 327/157 |
| 2013/0222067 A1* | 8/2013 | Yin et al. | 331/25 |

OTHER PUBLICATIONS

M.H. Perrott et al., "A Low-Area Switched-Resistor Loop Filter Technique for Fractional-N Synthesizers Applied to a MEMS-Based Programmable Oscillator," IEEE International Solid-State Circuits Conference (ISSCC), 2010, pp. 244-245a.

A. Rylyakov et al., Bang-Bang Digital PLLs at 11 and 20GHz with sub-200fs Integrated Jitter for High-Speed Serial Communication Applications, IEEE International Solid-State Circuits Conference (ISSCC), 2009, pp. 94-95a.

* cited by examiner

300

400

500

600

700

800

HYBRID PHASE-LOCKED LOOP ARCHITECTURES

STATEMENT REGARDING FEDERALLY SPONSORED RESEARCH OR DEVELOPMENT

This invention was made with Government support under Contract No.: FA8650-09-C-7924 (awarded by Defense Advanced Research Projects Agency (DARPA)). The Government has certain rights in this invention.

TECHNICAL FIELD

The field relates generally to phase locked loop (PLL) architectures such as hybrid PLL architectures having digital integrating paths and analog proportional paths.

BACKGROUND

In general, a PLL is a circuit designed to minimize a difference in frequency and/or phase between two signals. PLL circuits are widely used in applications where it is necessary to have two signals that have a known relationship to one another. For example, when transmitting information from a sending device to a receiving device, it is necessary to have a local clock of the receiving device in sync with a clock of the sending device so that the information can be reliably transmitted.

A PLL circuit can be implemented using various types of known architectures in which a forward control path of the PLL circuit includes separate proportional and integrating control paths. In a full digital implementation, both the proportional and integrating control paths are implemented using all digital components. An all-digital approach has advantages of being portable and scalable for other processes and applications. For example, an all-digital PLL implementation is needed for complex circuits such as memory devices, wherein a system clock of certain types of memory devices must be in sync with, for example, data so that data may be reliably written to or read from the memory. While an all-digital PLL architecture requires no analog circuitry, the digital nature of the phase measurement scheme can result in spurs in the output spectrum. Furthermore, the small signal parameters of an all-digital PLL can be a highly sensitive to deterministic jitter, resulting in changes in the PLL transfer function in the presence of noise on the power supplies.

In other known dual-path PLL architectures, a PLL circuit may be a "hybrid" framework in which both analog and digital components are employed in the control paths. For instance, hybrid PLL architecture may include a digital integrating control path and an analog proportional control path. Various circuit architectures and methods for implementing analog proportional control paths are known in the art, but these techniques have disadvantages of requiring significant amounts of complex analog circuitry. For example, in some known architectures, multiple operational amplifiers are required, in addition to a complex time-to-digital converter (TDC), or complex resettable switched resistor filters.

SUMMARY

Exemplary embodiments of the invention generally include phase locked loop (PLL) architectures such as hybrid PLL architectures having digital integrating paths and analog proportional paths.

In one embodiment, a phase locked loop (PLL) circuit includes a phase and frequency detector (PFD), a digitally controlled oscillator (DCO), a digital integrating control path, an analog proportional control path, and a feedback circuit. The PFD compares a reference clock signal and a first feedback clock signal to determine a phase difference and a frequency difference between the reference and first feedback clock signals, and generates a first control signal that indicates a frequency difference between the reference and first feedback clock signals, and generates a second control signal that indicates a phase difference between the reference and first feedback clock signals. The DCO generates an output signal having a target frequency. The digital integrating control path is responsive to the first control signal output from the PFD to generate a first DCO control signal to adjust a frequency of the output signal of the DCO to the target frequency. The analog proportional control path is responsive to the second control signal output from the PFD to generate a second DCO control signal to adjust a phase of the output signal of the DCO. The feedback circuit generates the first feedback clock signal based on the output signal from the DCO.

In another exemplary embodiment, the analog proportional control path includes a charge pump circuit that is responsive to the second control signal to adjust an analog proportional control voltage on an output node of the charge pump circuit. The charge pump circuit can include a first switch, a second switch, a first proportional resistor, a second proportional resistor, a load resistor, and a ripple capacitor. The first switch and the first proportional resistor are serially connected between a first power supply node and the output node of the charge pump circuit. The second proportional resistor and the second switch are serially connected between the output node and a second power supply node. The load resistor is connected between a third power supply node and the output node. The ripple capacitor is connected between the third power supply node and the output node. A common voltage is applied to the third power supply node.

In yet another exemplary embodiment, the digital integrating control path includes a digital integrator that receives the first control signal output from the PFD, a first sigma-delta modulator connected to an output of the digital integrator circuit, and a second sigma-delta modulator connected to an output of the first sigma delta modulator. The digital integrator and the first sigma-delta modulator operate using the first feedback clock signal generated by the feedback circuit. The second sigma-delta modulator operates using a second feedback clock signal generated by the feedback circuit. The second feedback clock signal has a frequency that is greater than a frequency of the first feedback clock signal.

In another exemplary embodiment, the digital integrating control path may further include an RC filter network connected between an output of the second sigma-delta modulator and a dithering input control port of the DCO.

These and other exemplary embodiments of the present invention will become apparent from the following detailed description of exemplary embodiments thereof, which is to be read in connection with the accompanying drawings.

DETAILED DESCRIPTION OF EXEMPLARY EMBODIMENTS

Figure 1:
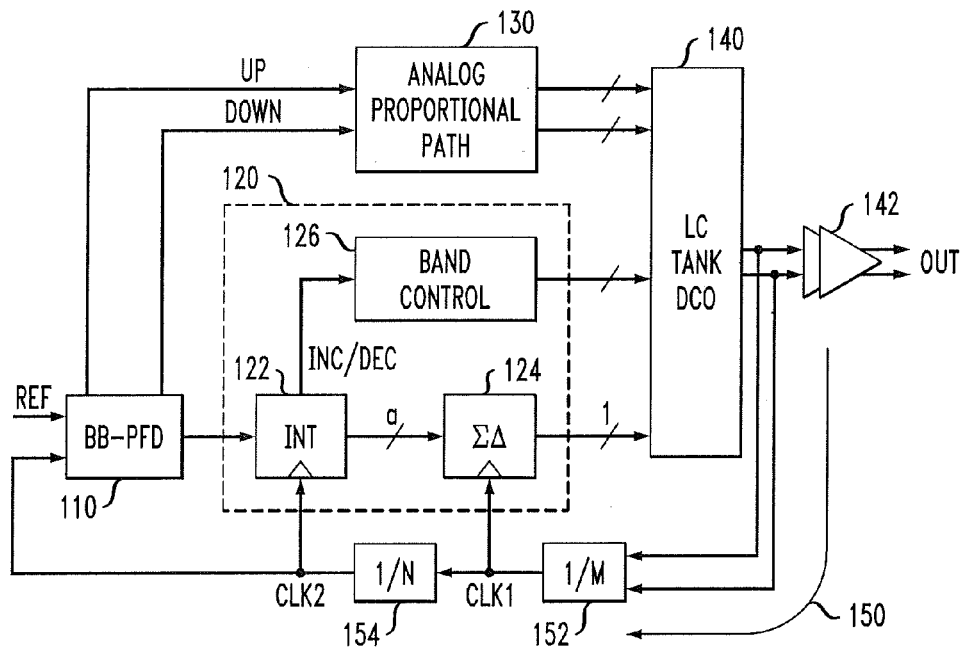
FIG. 1 is a block diagram of a hybrid PLL circuit according to an embodiment of the invention.

Exemplary embodiments will now be discussed in further detail with regard to phase locked loop (PLL) architectures such as hybrid PLL architectures having digital integrating paths and analog proportional paths. FIG. 1 is a block diagram of a hybrid PLL circuit according to an embodiment of the invention. In particular, FIG. 1 shows an architecture of a hybrid PLL circuit 100 comprising a phase-frequency detector 110, a digital integrating control path 120, an analog proportional control path 130, a digitally controlled oscillator 140 (DCO), output buffers 142, and a feedback path 150. The digital integrating control path 120 comprises a digital integrator circuit 122, a sigma-delta circuit 124, and a band control circuit 126. The feedback path 150 comprises a first clock divider circuit 152 that generates a first clock signal (CLK1), and a second clock divider circuit 154 that generates a second clock signal (CLK2). The first clock divider circuit 152 (or prescaler circuit) receives an output signal OUT from the DCO 140 and divides the frequency of the OUT signal by 1/M (where M can be 16, for example) to generate CLK1. The first clock signal CLK1 drives the sigma-delta circuit 124 to generate a 1-bit control signal that is input to a dithering input control port of the DCO 140. The second divider circuit 154 may be a programmable divider circuit that divides the frequency of the first clock signal CLK1 by a programmable integer N to generate the second clock signal CLK2. The second clock signal CLK2 drives the digital integrator circuit 122 at a lower frequency than the frequency of the first clock signal CLK1. The second clock signal CLK2 is fed back to an input of the phase-frequency detector 110.

In general, the PLL 100 operates by receiving a reference (REF) signal and generating an OUT signal from the DCO 140, which is phase-locked to REF signal. More specifically, in the dual-path PLL circuit architecture of FIG. 1, the digital integrating control path 120 and analog proportional control path 130 are forward control paths that provide control signals to the DCO 140 to adjust the phase and frequency of the OUT signal to be the same or similar to that of the input REF signal. The digital integrating control path 120 operates to force the average DCO frequency to a correct target value when a difference is detected between the frequency of the DCO output signal OUT and the frequency of the REF input signal, whereas the analog proportional control path 130 operates to adjust the DCO output signal OUT for transient correction of phase errors between the OUT and REF signals. In the exemplary embodiment of FIG. 1, the PLL 100 operates to ensure that the frequency of the output signal OUT from the DCO 140 is (M*N) times the frequency of the reference REF signal.

More specifically, the phase-frequency detector 110 compares arriving edges of the reference clock REF and the feedback clock CLK2. The phase-frequency detector 110 determines if there is a difference in frequency between the REF and CLK2 signals and generates an output signal (e.g., 1-bit early-late data) to the digital integrating path, which indicates which clock frequency is higher. The digital integrator circuit 122, which can be implemented as an accumulator (e.g., 24-bit accumulator), receives the output of the phase-frequency detector 110 and generates signals that are input to the delta-sigma circuit 124 and the band control circuit 126. For example, the digital integrator 122 outputs overflow-underflow (inc/dec) signals to the band control circuit 126, which drives an array (rows and columns) of varactors in the DCO 140. The band control circuit 126 generates a digital control signal in response to the inc/dec signals from the digital integrator circuit 122 to change a net capacitance in the DCO circuit 140 and thereby tune the frequency of the output signal OUT. Moreover, a given number (a) of the most significant bits of the internal state of the accumulator 122 are also applied to the DCO 140 via a dither output of the $1^{st}$ order delta-sigma modulator circuit 124 to adjust a capacitance of a 1-bit driven varactor in the DCO circuit 140.

It is to be noted that various techniques and circuits for implementing the DCO circuit 140 and the components 122, 124 and 126 of the digital integrating control path 120, are well known to those of ordinary skill in the art and, therefore, a more detailed explanation is not necessary for understanding by one of ordinary skill in the art. For instance, the digital integrating control path 120 can be implemented using the architectures and methods disclosed in U.S. Pat. No. 8,138,840, which is commonly assigned and fully incorporated herein by reference.

Figure 4:
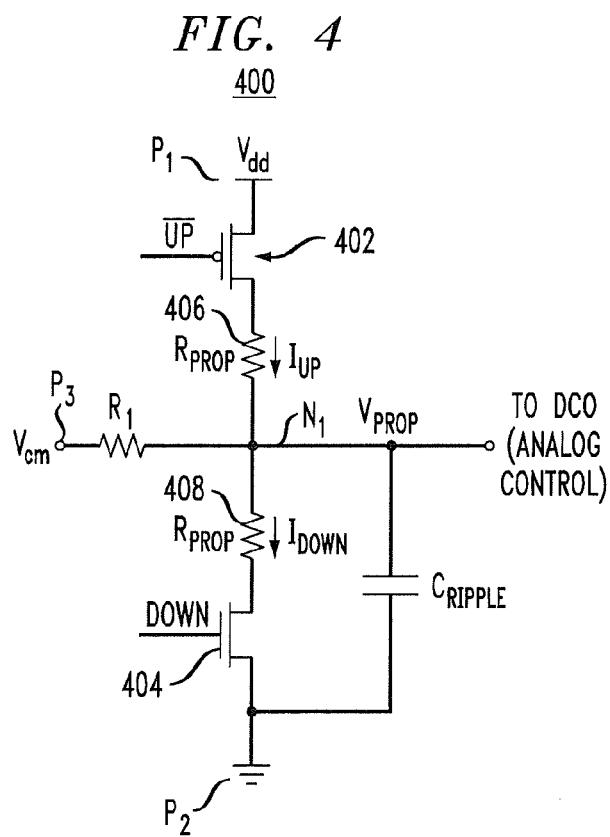
FIG. 4 schematically illustrates a charge pump circuit according to an exemplary embodiment of the invention, which may be employed in an analog proportional control path of a hybrid PLL circuit.

The phase-frequency detector 110 further operates by comparing arriving edges of the REF and CLK2 signals to determine if there is a difference in phase between the REF and CLK2 signals, and generate UP and DOWN control signals to the analog proportional control path 130. The pulse widths of the UP and DOWN control signals encode information regarding the phase difference (or phase error) between the REF and CLK2 signals. The analog proportional control path 130 is responsive to the UP and DOWN control signals to generate analog control signals that are input to the DCO circuit 140 to tune the DCO output clock signal OUT. The analog proportional control path 130 provides a low gain, high frequency control path for transient correction of phase errors in instances when the frequencies of the reference clock REF and feedback clock CLK2 signals are the same or similar. In one exemplary embodiment of the invention, the analog proportional control path 130 implements a charge pump circuit architecture as shown in FIG. 4, the details of which will be explained in further detail below.

Figure 2:
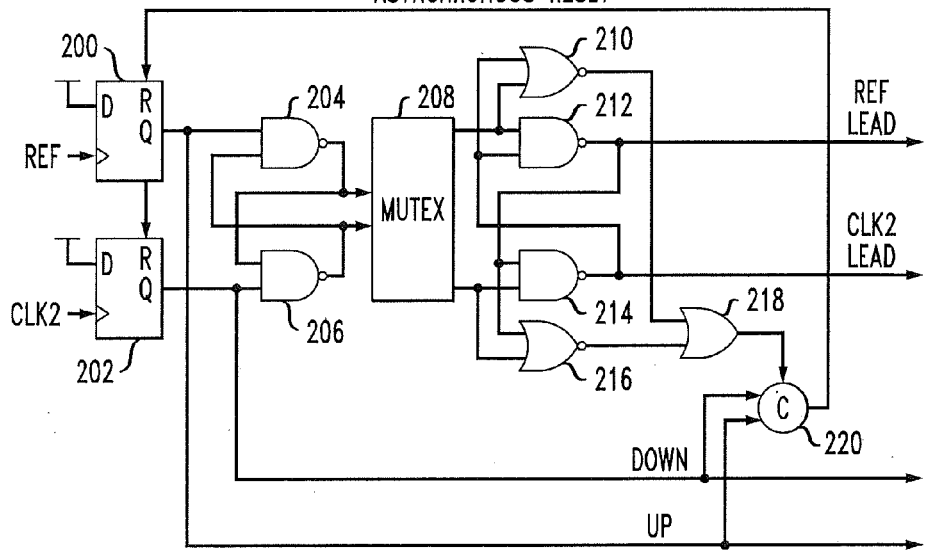
FIG. 2 is a schematic circuit diagram of a phase-frequency detector according to an exemplary embodiment of the invention.
Figure 8:
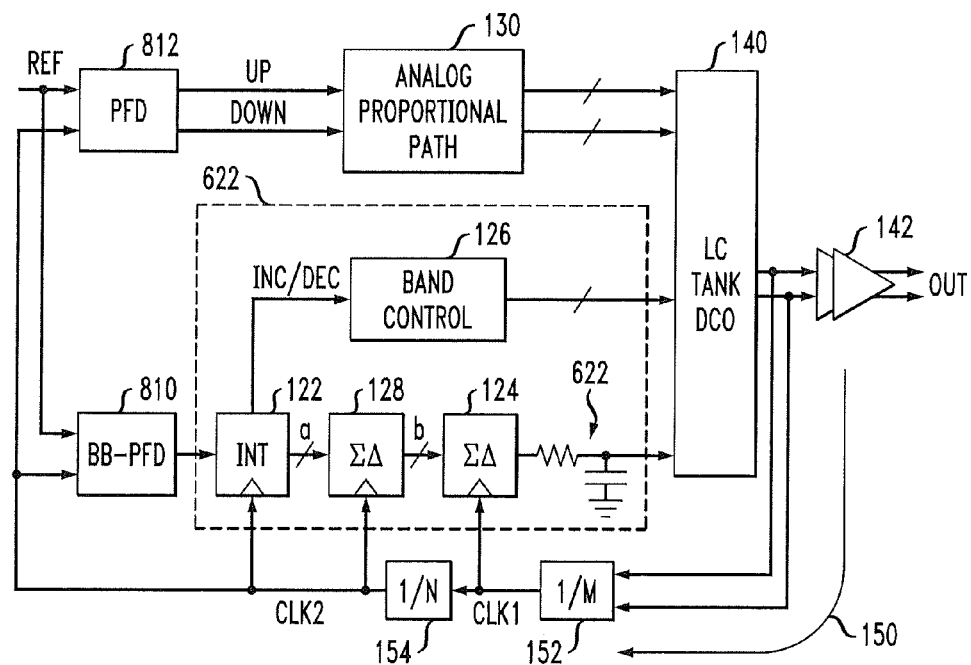
FIG. 8 is a block diagram of a hybrid PLL circuit 800 according to another embodiment of the invention, wherein two separate phase-frequency detectors are used to control a digital integrating control path and an analog proportional control path.

In the exemplary embodiment shown in FIG. 1, the PLL 100 implements a single phase-frequency detector 110 to generate output signals for controlling the digital integrating control path 120 and the analog proportional control path 130 (although separate phase-frequency detectors may be implemented as discussed below with reference to FIG. 8). In one exemplary embodiment of the invention, the phase-frequency detector 110 is implemented using an architecture as shown in FIG. 2. In particular, FIG. 2 illustrates the phase-frequency detector 110 implemented to have a bang-bang phase-frequency detector framework. The bang-bang phase detector 110 of FIG. 2 comprises a first edge-triggered D flip-flop 200 and a second edge-triggered D flip-flop 202. The data inputs, D, of the first and second edge-triggered D flip-flops 200 and 202 are tied to a logic "high" level. The reference clock REF is input to a clock port of the first edge-triggered D flip-flop 200 and the feedback clock signal CLK2 is input to a clock port of the second edge-triggered D flip-flop 202. The outputs, Q, of the first and second edge-triggered D flip-flops 200 and 202 are connected to inputs of cross-coupled NAND gates 204 and 206, respectively. The outputs of the NAND gates 204 and 206 are connected to a MUTEX (mutual exclusion element) block 208.

Further, the outputs of the MUTEX 208 are connected to inputs of cross-coupled NAND gates 212 and 214. A first NOR gate 210 has one input connected to one output of the MUTEX 208 and another input connected to an output of the NAND gate 214. A second NOR gate 216 has one input connected to a second output of the MUTEX 208 and another input connected to an output of the NAND gate 212. The outputs of the NOR gates 210 and 216 are connected to inputs of an OR gate 218. An output of the OR gate 218 is connected to a C memory element 220. The Q outputs of the edge-triggered D flip-flops 200 and 202 are also connected to inputs of the C memory element 220. An output of the C memory element 220 is connected to reset input ports, R, of the edge-triggered D flip-flops 200 and 202.

The exemplary phase-frequency detector framework 100 shown in FIG. 2 is similar in structure and operation of a phase frequency detector disclosed in commonly assigned U.S. Pat. No. 7,443,351, which is incorporated herein by reference. However, the phase-frequency detector 110 in FIG. 2 implements in input latch (cross-coupled NAND gates 204 and 206) to store an output of the first and second edge-triggered D flip flops 200 and 202 for a given cycle. Moreover, the outputs of the first and second edge-triggered D flip flops 200 and 202 are used as the UP and DOWN control signals for controlling the analog proportional path 130, in addition to providing inputs to the C memory element 220 for resetting the first and second edge-triggered D flip flops 200 and 202.

The output of the C memory element 220 provides an asynchronous reset signal to reset the outputs of the first and second edge-triggered D flip-flops 200 and 202 to logic "0". The output of the C memory element 220 changes when either all the inputs to the C memory element 220 are high or all the inputs are low. Specifically, the output changes to logic high when all the inputs are high, and the output changes to low when all the inputs are low. Other changes to the inputs to the C element do not cause any change to the output, and the output of the C memory element will remain in a previous state.

In operation, when a rising edge of a clock signal REF and CLK2 is applied to the clock ports of the first and second edge-triggered D flip flops 200 and 202, respectively, the output Q of the first and second edge-triggered D flip flops 200 and 202 changes from logic low (reset state) to logic high (since the D inputs are tied to logic high). The input latch (NAND gates 204 and 206) captures an input clock state in a given detection cycle. The MUTEX 208 determines which of the clock signals REF and CLK2 is received first in time during a particular detection cycle based on the clock input state of the input latch (204, 206), and generates an output signal indicating which of the clock signal REF or CLK2 was received first. The output latch (NAND gates 212 and 214) output respective control signals REF Lead and CLK2 Lead, which indicate which clock signal REF and CLK2 was received first. Details of the operational modes of a phase-frequency detector, which is similar to the phase-frequency detector 110 of FIG. 2, may be found in the above-incorporated U.S. Pat. No. 7,443,251.

Figure 3A:
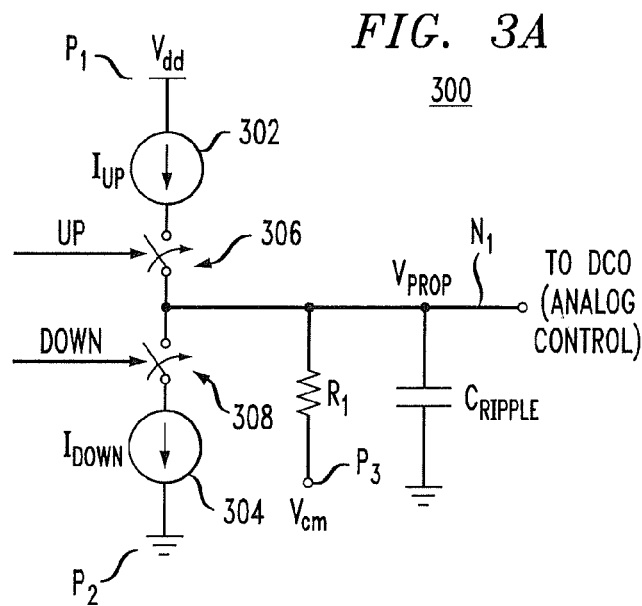
FIGS. 3A and 3B schematically illustrate a charge pump circuit that may be employed in an analog proportional control path of a hybrid PLL circuit according to an exemplary embodiment of the invention.
Figure 3B:
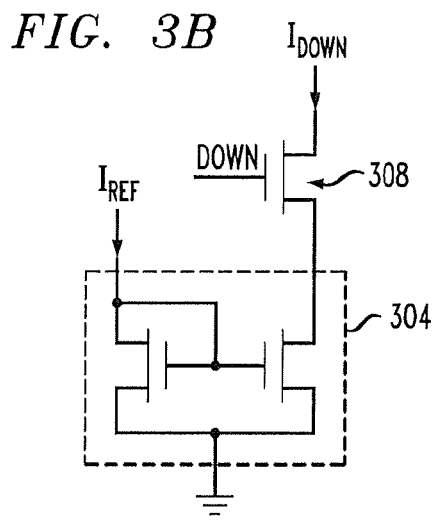

The analog proportional control path can be implemented using a charge pump circuit framework that is responsive to the Up and Down control signals output from the phase-frequency detector 110. For example, FIGS. 3A and 3B schematically illustrates a charge pump circuit that may be employed in an analog proportional control path of a hybrid PLL circuit in one illustrative embodiment. In particular, FIG. 3A shows a charge pump circuit 300 having a first current source 302, a second current source 304, a first switch 306, a second switch 308, a load resistor $R_1$, and a ripple capacitor $C_{ripple}$ (wherein load resistor $R_1$, and a load ripple capacitor $C_{ripple}$ form a loop filter). The first current source 302 is connected to a first power supply node P1 (e.g., Vdd), the second current source 304 is connected to a second power supply node P2 (e.g., ground), the load resistor $R_1$ is connected between a third power supply node P3 (Vcm) and an output node N1, and the ripple capacitor $C_{ripple}$ is connected between the third power supply node P3 and the output node N1. The first and second switches 306 and 308 may be implemented using NMOS transistors, and the first and second current sources 302 and 304 may be implemented using high impedance current mirror circuits.

For instance, FIG. 3B, shows the second switch 308 implemented as an NMOS transistor with the Down control pulse applied to the gate terminal of the NMOS transistor 308. Moreover, FIG. 3B shows the second current source 304 implemented as a current mirror that mirrors a reference current Iref to generate the output current $I_{Down}$ that flows through the second switch 308 when the second switch is activated in response to the Down control signal. The first switch 306 and first current source 302 are implemented using a circuit framework similar to FIG. 3B.

The charge pump circuit 300 of FIG. 3A has a well-known architecture and mode of operation, which are readily understood by those of ordinary skill in the art. In general, the first and second current sources 302 and 304 (e.g., high output impedance current sources) are used to generate the required $I_{Up}$ and $I_{Down}$ currents to adjust a proportional control voltage Vprop on the output node N1 of the charge pump circuit 300, which is applied to the DCO 140. The first and second switches 306 and 308 are activated in response to respective Up and Down control signals (pulses) output from the phase-frequency detector circuit 110. In particular, when a Down control signal received from the phase-frequency detector 110 activates the second switch 308, the current $I_{Down}$ flows between the output node N1 and the second supply voltage node P2 (e.g., ground). When an Up control signal received from the phase-frequency detector 100 activates the first switch 302, the current $I_{Up}$ flows between the first supply voltage node P1 (e.g., Vdd) and the output node N1. The first and second switches 306 and 308 are activated for very short periods of time during a given reference cycle to apply the currents $I_{Up}$, and $I_{Down}$ to the load resistor $R_1$ from respective first and second current sources 302 and 304.

As noted above, in a dual-path PLL such as shown in FIG. 1 which has a separate digital integrating control path 120, the digital integrating control path 120 forces the average output frequency OUT of the DCO 140 to the correct value. The operation of the digital integrating control path 120 forces the average of the Up and Down control signals to be the same in a steady state condition when the output signal OUT of the DCO 140 is phase locked to the input reference signal REF. In steady state, the currents $I_{Up}$ and $I_{Down}$ are applied to the load resistor $R_1$ for approximately equal amounts of time, such that the proportional control voltage Vprop on the output node N1 is approximately equal to the common mode voltage Vcm applied to the third supply voltage node P3. In one exemplary embodiment, the common mode voltage Vcm is preselected to be half of the supply voltage, i.e., $V_{cm}=V_{dd}/2$. Therefore, when the PLL circuit 100 is phase-locked, the proportional control voltage Vprop is maintained close to the common mode voltage value $V_{cm}$, irrespective of the frequency of the output signal OUT.

The analog proportional control path 130 operates to slightly adjust the proportional control voltage Vprop on the output node N1 for transient correction of phase errors. The charge pump 300 applies narrow pulses of the $I_{Up}$ and $I_{Down}$ currents to the load resistor R1 which temporarily moves the proportional control voltage Vprop away from the common mode voltage value Vcm. The proportional path resistor R1 pulls the proportional control voltage Vprop on the output node N1 back to the common mode voltage $V_{cm}$ level.

In the charge pump circuit 300 of FIG. 3A, it is desirable for the $I_{Up}$ and $I_{Down}$ to be of equal magnitude irrespective of the output frequency, because mismatches between $I_{Up}$ and $I_{Down}$ will result in reference spurs and phase offsets. In a conventional single path PLL, matching between the two currents $I_{Up}$ and $I_{Down}$ must be maintained over a wide voltage range, necessitating the requirement for high impedance current sources, as shown in FIG. 3B. However, with conventional CMOS processes, using high-impedance current sources (e.g., FIG. 3B) in a charge pump-based analog proportional path can be problematic as the voltage headroom become smaller, which limits the operation of the high-impedance current sources. Moreover, the use of current reference mirrors can introduce unwanted noise.

In a dual-path hybrid PLL circuit such as shown in FIG. 1 having a digital integrating control path 120, the proportional control voltage Vprop generated by the analog proportional control path 130 does not need to vary much from the common mode control voltage Vcm. As a result, a more simplified, limited range charge pump architecture can be implemented in the analog proportional control path 130 of FIG. 1, which does not implement high-impedance current sources, such as shown in FIG. 3B.

FIG. 4 schematically illustrates a charge pump circuit that may be employed in an analog proportional control path of a hybrid PLL circuit, according to another exemplary embodiment of the invention. The embodiment of FIG. 4 illustrates a charge pump architecture 400 in which the high impedance current sources in FIGS. 3A/3B are replaced with series resistors and switches. In particular, the charge pump 400 of FIG. 4 comprises a first switch 402, a second switch 404, a first proportional resistor 406, a second proportional resistor 408, a load resistor $R_1$, and a ripple capacitor $C_{ripple}$ (wherein load resistor $R_1$, and a load ripple capacitor $C_{ripple}$ form a loop filter). The first switch 402 and the first proportional resistor 406 are serially connected between a first power supply node P1 (e.g., Vdd) and an output node N1. The second proportional resistor 408 and the second switch 404 are serially connected between the output node N1 and a second power supply node P2 (e.g., ground). The load resistor $R_1$ is connected between a third power supply node P3 (Vcm) and the output node N1, and the ripple capacitor $C_{ripple}$ is connected between the third power supply node P3 and the output node N1.

The first switch 402 may be implemented as a PMOS transistor and the second switch 404 may be implemented as an NMOS transistor. In an illustrative embodiment, the first and second switches 402 and 404 are designed to have a large W/L ratio, resulting in a small "On" resistance relative to the resistance $R_{prop}$ of the first and second proportional resistors 406 and 408. For a supply voltage of $V_{dd}$, and an output control voltage of $V_{prop}$, the Up and Down currents will be approximately $I_{Up}=(V_{dd}-V_{prop})/R_{prop}$ and $I_{Down}=V_{prop}/R_{prop}$, neglecting the series resistance of the switches 402 and 404. When the PLL circuit is in a phase-locked state, with a zero or very small phase error, the $I_{Up}$ and $I_{Down}$ currents will switch on for approximately equal times. This will cause the proportional control voltage Vprop to be very close to the midrange common voltage, i.e. $V_{prop} \approx V_{dd}/2$. The currents then become:

$$I_{Up}=(V_{dd}-V_{prop})/R_{prop} \approx (V_{dd}-V_{dd}/2)/R_{prop}=Vdd/(2*R_{prop}) \text{ and}$$

$$I_{Down}=V_{prop}/R_{prop} \approx V_{dd}/(2*R_{prop}),$$

wherein when the PLL circuit is phase-locked, $I_{Up}=I_{Down}$.

The illustrative charge pump architecture of FIG. 4 may be implemented in the analog proportional control path 130 working in parallel with the separate digital integrating control path 120 (separate frequency control loop), which guarantees that the DCO 140 is oscillating at the correct target frequency. Indeed, as noted above, when the output signal OUT of the DCO 140 is at the correct target frequency, the analog proportional control path 130 only has to correct for temporary phase disturbances, so the proportional path control voltage Vprop never needs to move far from its common-mode (mid-point) value Vcm.

There are various benefits from using a charge pump architecture as shown in FIG. 4 as compared to the charge pump architecture of FIG. 3A which uses CMOS current mirrors to generate the $I_{Up}$ and $I_{Down}$ currents. For instance, the proportional resistors 406 and 408 produce significantly less noise than the CMOS current sources in a conventional charge pump. In particular, at low frequency offsets (below 1 MHz) the flicker noise contribution of the resistor and switch configuration can be orders of magnitudes less than that of a high impedance current source. Moreover, implementing high impedance current sources in low headroom CMOS processes is becoming increasingly difficult. The CMOS transistors in a nano-meter process are not optimized to be used as well-matched current mirrors with high output impedances. Furthermore, the charge pump circuit 400 of FIG. 4 does not need reference currents to be generated or distributed around the chip. Moreover, the proportional resistors 406 and 408 in FIG. 4 can be implemented using the same type of resistors and, therefore, the resistors 406 and 408 can be well-matched using well-known physical layout techniques, e.g. common centroid. The same is not possible in a charge pump with high-impedance current sources, where the Down current is generated with a NMOS transistor and the Up current is generated with a PMOS transistor.

In the exemplary embodiment of FIG. 1, the output of the digital integrator 122 must be translated from an "a" bit signal on clock domain CLK2 to a 1-bit signal on clock domain CLK2 before controlling the DCO 140. In the illustrative embodiment of FIG. 1, the clock signal CLK2 is much faster than the clock signal CLK1. Operating the sigma-delta circuit bock 124 with both a large data width and at a high frequency can be challenging. For this reason, some methods are commonly applied to quantize the data width "a" to a smaller data width "b" before the sigma-delta modulator 124, or otherwise simply disregard some least significant bits of the control signal output from the digital integrator circuit 122. However, this quantization can result in a degradation of performance, in the form of PLL limit cycles for example.

Figure 5:
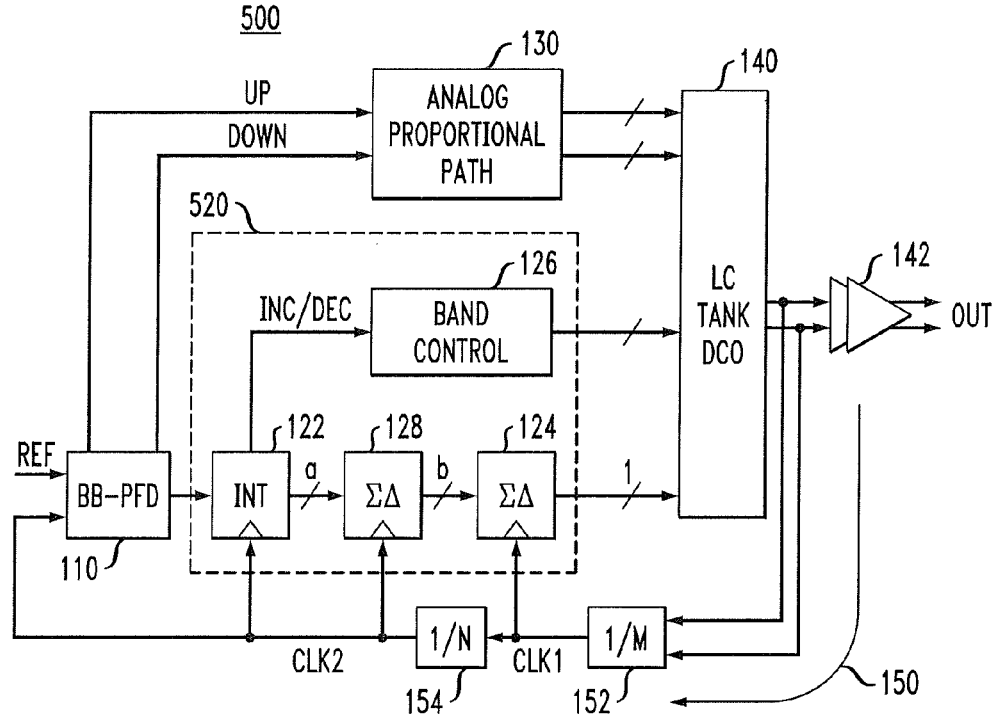
FIG. 5 is a block diagram of a hybrid PLL circuit according to another embodiment of the invention, in which a series of sigma-delta circuits are implemented in a digital integrating control path of the PLL circuit.

In accordance with an illustrative embodiment of the invention, an additional sigma-delta modulator can be used in the digital integrating control path 120 of the PLL circuit 100 of FIG. 1 to convert a control signal of width "a" to a control signal of width "b" on the slower clock domain CLK2, before passing to clock domain CLK1. In particular, FIG. 5 is a block diagram of a PLL circuit according to another embodiment of the invention, in which a series of sigma-delta modulator circuits are implemented in a digital integrating control path of the PLL circuit. FIG. 5 shows an architecture of a hybrid PLL circuit 500 that is similar to the PLL circuit 100 of FIG. 1, except that a digital integrating control path 520 shown in FIG. 5 includes a second sigma-delta circuit block 128 that operates on the slower clock signal CLK2 to convert the width "a" of the output signal from the digital integrator to a control signal of width "b", wherein the sigma-delta circuit 124 converts the lower data width signal "b" to a one bit signal on the faster clock domain CLK1. Since the clock signal CLK2 is slower than the clock signal CLK1, the first sigma-delta circuit 128 can accommodate a larger data width "a", wherein the second, faster, sigma-delta circuit 124 can readily accommodate a smaller data width of "b."

In the exemplary embodiments of FIGS. 1 and 5, the digital integrating control paths 120 and 520 control the digital bands of the DCO 140 (via the band control circuit 126) as well as 1-bit varactor in the DCO 140, which is driven by the $1^{st}$ order sigma-delta modulator 124. In general, sigma-delta modulators (e.g., block 124) have a well-known property of producing high frequency spurious content in their output spectrum. This spurious content can degrade the performance of the PLL by adding noise to the output spectrum. In an illustrative embodiment of the invention, this noise can be mitigated by adding an additional RC filter between the sigma-delta modulator 124 and the 1-bit control port of the DCO 140.

Figure 6:
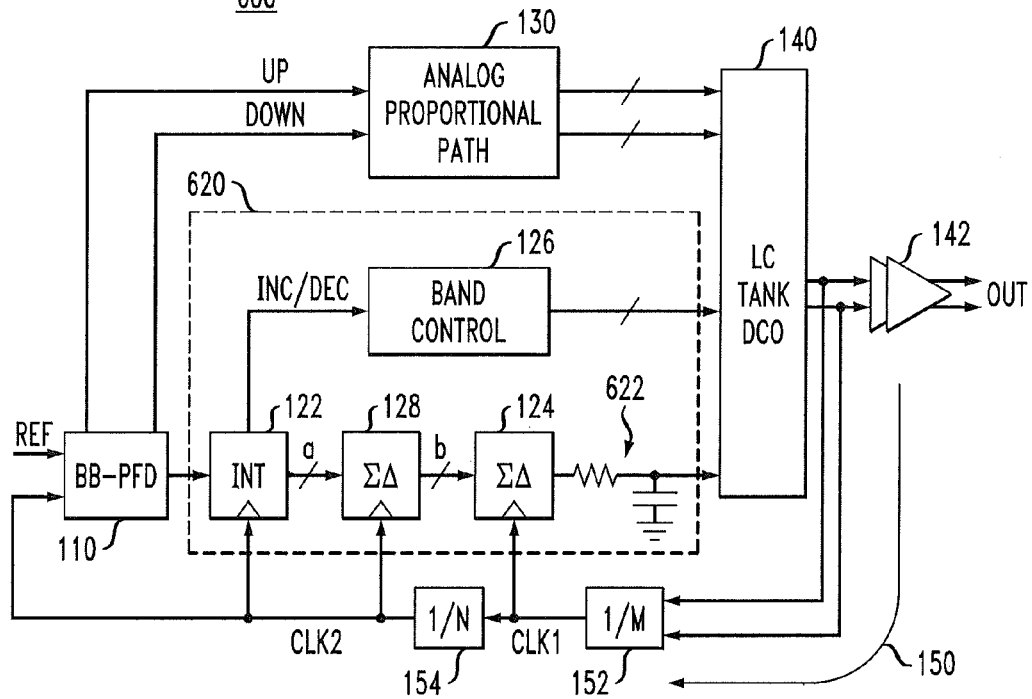
FIG. 6 is a block diagram of a hybrid PLL circuit according to another embodiment of the invention, in which an RC filter is implemented in a digital integrating control path of the PLL circuit.

For instance, FIG. 6 is a block diagram of a PLL circuit according to another embodiment of the invention, in which an RC filter is implemented in a digital integrating control path of the PLL circuit. In particular, FIG. 6 shows an architecture of a hybrid PLL circuit 500 that is similar to the PLL circuit 500 of FIG. 5, except that a digital integrating control control path 620 shown in FIG. 6 includes an RC filter 622 between the sigma-delta modulator 124 and the 1-bit control port of the DCO 140. The RC filter 622 prevents high frequency noise output from the sigma-delta modulator 124 from reaching the DCO 140. The output of the band control circuit 126 is left unfiltered. Since the RC filter 622 is in series with the digital integrator circuit 122 (accumulator), charge leakage in the capacitor of the RC filter 622 does lead to spurs or offsets, as would be the case if the capacitor were leaky in the integral path of an analog PLL.

Figure 7:
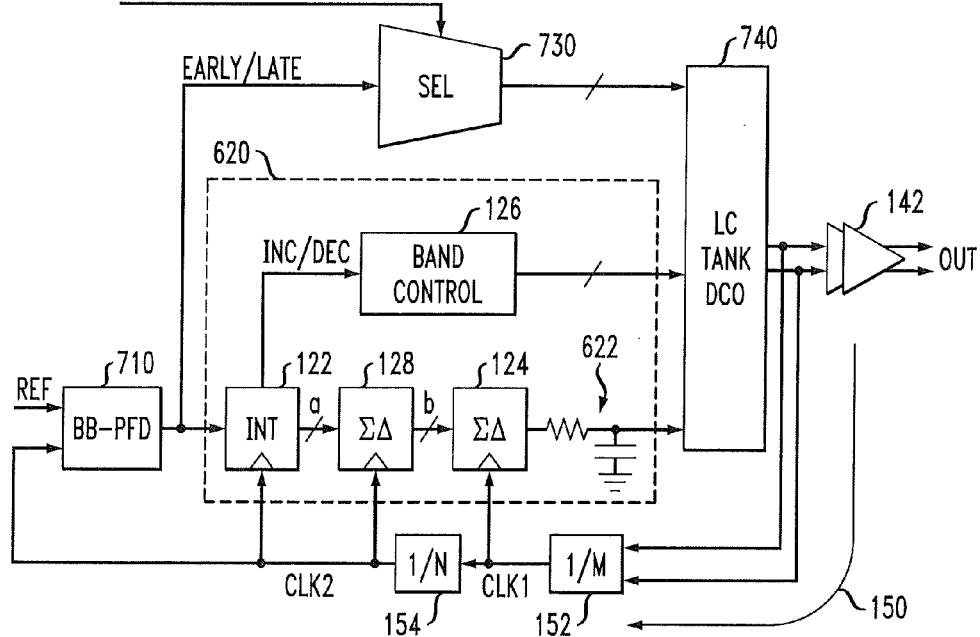
FIG. 7 is a block diagram of an all-digital PLL circuit having a digital integrating control path that includes a series of sigma-delta modulator circuits and an RC filter, according to an exemplary embodiment of the invention.

In other illustrative embodiments of the invention, an all-digital PLL circuit may be implemented having a digital integrating control path that includes a series of sigma-delta modulator circuits and/or an RC filter, such as shown in FIG. 7. In particular, FIG. 7 shows an architecture of a digital PLL circuit 700 having a digital integrating control path 620 which is similar to that shown in FIG. 6, having a series of sigma-delta modulators 128 and 124 and an optional RC filter 622. The PLL circuit 700 of FIG. 7 includes a digital proportional path comprising a programmable selector circuit 730. In the exemplary embodiment of FIG. 7, a phase-frequency detector 710 outputs a signal (e.g., 1-bit early-late data) to the digital integrating path 620 as well as the selector 730 in the digital proportional path. The phase-frequency detector 710 may be implemented using the architecture of FIG. 2, but where the REF Lead and CLK2 Lead signals are output to both the integrating and proportional paths, and the Up and Down signals are just input to the C memory element 220 for resetting the input edge-triggered D flip-flops 200 and 202. In the exemplary embodiment of FIG. 7, the gain of the digital proportional path is set in the programmable selector 730, which passes the PFD output directly to the digital control input ports of the DCO 140.

In the exemplary embodiments discussed above, a single phase-frequency detector is used to generate output signals to both the integrating and proportional paths. In other embodiments of the invention, separate phase-frequency detector circuits can be used for the proportional control path and the integrating control path. For example, FIG. 8 is a block diagram of a hybrid PLL circuit 800 according to another embodiment of the invention, in two separate phase-frequency detectors 810 and 812 are used to control a digital integrating control path 622 and an analog proportional control path 130. In the exemplary embodiment of FIG. 8, a first phase-frequency detector 810 is used to control the digital integrating control path 622 and a second phase-frequency detector 812 is used to control the analog proportional control path 130. In the illustrative embodiment, the analog proportional control path 130 and the digital integrating control path 622 may be implemented using the architectures and techniques discussed above. The different phase-frequency detectors 810 and 812 may be implemented using the architecture of FIG. 2 or other well-known techniques, depending on the given application.

Further aspects of the present invention provide PLL circuits that can be utilized in integrated circuit chips with various analog and digital integrated circuitries. In particular, integrated circuit dies can be fabricated having PLL circuits and other semiconductor devices such as field-effect transistors, bipolar transistors, metal-oxide-semiconductor transistors, diodes, resistors, capacitors, inductors, etc., forming analog and/or digital circuits. The PLL circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A phase locked loop (PLL) circuit, comprising:
   a phase and frequency detector (PFD), which compares a reference clock signal and a first feedback clock signal to determine a phase difference and a frequency difference between the reference and first feedback clock signals, which generates a first control signal that indicates a frequency difference between the reference and first feedback clock signals, and which generates a second control signal that indicates a phase difference between the reference and first feedback clock signals;

a digitally controlled oscillator (DCO) that generates an output signal having a target frequency;

a digital integrating control path that is responsive to the first control signal output from the PFD to generate a first. DCO control signal to adjust a frequency of the output signal of the DCO to the target frequency;

an analog proportional control path that is responsive to the second control signal output from the PFD to generate a second DCO control signal to adjust a phase of the output signal of the DCO when the frequency of the output signal of the DCO is similar to or the same as the target frequency; and a feedback circuit to generate the first feedback clock signal based on the output signal from the DCO.

2. The PILL circuit of claim 1, wherein the analog proportional control path comprises a charge pump circuit that is responsive to the second control signal to adjust an analog proportional control voltage on an output node of the charge pump circuit.

3. A phase locked loop (PLL) circuit, comprising:

a phase and frequency detector (PFD), which compares a reference clock signal and a first feedback clock signal to determine a phase difference and a frequency difference between the reference and first feedback clock signals, which generates a first control signal that indicates a frequency difference between the reference and first feedback clock signals, and which generates a second control signal that indicates a phase difference between the reference and first feedback clock signals;

a digitally controlled oscillator (DCO) that generates an output signal having a target frequency, a digital integrating control path that is responsive to the first control signal output from the PFD to generate a first DCO control signal to adjust a frequency of the output signal of the DCO to the target frequency;

an analog proportional control path that is responsive to the second control signal output from the PFD to generate a second DCO control signal to adjust a phase of the output signal of the DCO; and a feedback circuit to generate the first feedback clock signal based on the output signal from the DCO, wherein the analog proportional control path comprises a charge pump circuit that is responsive to the second control signal to adjust an analog proportional control voltage on an output node of the charge pump circuit, wherein the charge pump circuit comprises:

a first switch;
a second switch;
a first proportional resistor;
a second proportional resistor;
a load resistor;
and a ripple capacitor, wherein the first switch and the first proportional resistor are serially connected between a first power supply node and the output node of the charge pump circuit, wherein the second proportional resistor and the second switch are serially connected between the output node and a second power supply node, wherein the load resistor is connected between a third power supply node and the output node, wherein the ripple capacitor is connected between the third power supply node and the output node, and wherein a common voltage is applied, to the third power supply node.

4. A phase locked (PFD) circuit, comprising:

a phase and frequency detector (PFD), which compares a reference clock signal and a first feedback clock signal to determine a phase difference and a frequency difference between the reference and first feedback clock signals, which generates a first control signal that indicates a frequency difference between the reference and first feedback clock signals, and which generates a second control signal that indicates a phase difference between the reference and first feedback clock signals;

a digitally controlled oscillator (DCO) that generates an output signal having a target frequency;

a digital integrating control path that is responsive to the first control signal output from the PFD to generate a first DCO control signal to adjust a frequency of the output signal of the DCO to the target frequency;

an analog proportional control path that is responsive to the second control signal output from the PFD to generate a second DCO control signal to adjust a phase of the output signal of the DCO; and a feedback circuit to generate the first feedback clock signal based on the output signal from the DCO, wherein the digital integrating control path comprises:

a digital integrator that receives the first control signal output from the PFD;

a first sigma-delta modulator connected to an output of the digital integrator circuit;

a second sigma-delta modulator connected to an output of the first sigma delta modulator;

wherein the digital integrator and the first sigma-delta modulator operate using the first feedback clock signal generated by the feedback circuit, wherein the second sigma-delta, modulator operates using a second feedback clock signal generated by the feedback circuit, wherein the second feedback clock signal has a frequency that is greater than a frequency of the first feedback dock signal.

5. The PLL circuit of claim 4, wherein the digital integrating control path further comprises an RC filter network connected between an output of the second sigma-delta modulator and a dithering input control port of the DCO.

6. The PLL circuit of claim 4, wherein the digital integrating control path further comprises a band control circuit connected to a second output of the digital integrator, wherein the band control circuit is responsive to control signal output from the digital integrator to generate a second DCO control signal to adjust a frequency of the output signal of the DCO to the target frequency.

7. A phase locked loop (PLL) circuit, comprising:

a phase and frequency detector (PFD), which compares a reference clock signal and a first feedback clock signal to determine a phase difference and a frequency difference between the reference and first feedback clock, signals, which generates a first control signal that indicates a frequency difference between the reference and first feedback clock signals, and which generates a second control signal that indicates a phase difference between the reference and first feedback clock signals;

a digitally controlled oscillator (DCO) that generates an output signal having a target frequency;

a digital integrating control path that is responsive to the first control signal output from the PFD to generate a first DCO control signal to adjust a frequency of the output signal of the DCO to the target frequency;

an analog proportional control path that is responsive to the second control signal output from the PFD to generate a second DCO control signal to adjust a phase of the output signal of the DCO; and
a feedback circuit to generate the first feedback clock signal based on the output signal from the DCO,
wherein the digital integrating control path comprises:
a digital integrator that receives the first control signal output from the PFD;
a sigma-delta modulator connected to an output of the digital integrator circuit; and
an RC filter network connected between an output of the sigma-delta modulator and a dithering input control port of the DCO,
wherein the digital integrator operates using the first feedback clock signal generated by the feedback circuit, and
wherein the sigma-delta modulator operates using a second feedback clock signal generated by the feedback circuit,
wherein the second feedback clock signal has a frequency that is greater than a frequency of the first feedback clock signal.

8. The PLL circuit of claim 7, wherein the digital integrating control path further comprises a band control circuit connected to a second output of the digital integrator, wherein the band control circuit is responsive to control signal output from the digital integrator to generate a second DCO control signal to adjust a frequency of the output signal of the DCO to the target frequency.

9. The phase locked loop (PLL) circuit of claim 4, wherein the analog proportional control path comprises a charge pump circuit that is responsive to the second control signal to adjust an analog proportional control voltage on an output node of the charge pump circuit, wherein the charge pump circuit comprises:
a first switch;
a second switch;
a first proportional resistor;
a second proportional resistor;
a load resistor;
and a ripple capacitor,
wherein the first switch and the first proportional resistor are serially connected between a first power supply node and the output node of the charge pump circuit,
wherein the second proportional resistor and the second switch are serially connected between the output node and a second power supply node,
wherein the load resistor is connected between a third power supply node and the output node,
wherein the ripple capacitor is connected between the third power supply node and the output node, and
wherein a common voltage is applied, to the third power supply node.

10. The phase locked loop (PLL) circuit of claim 7, wherein the analog proportional control path comprises a charge pump circuit that is responsive to the second control signal to adjust an analog proportional control voltage on an output node of the charge pump circuit, wherein the charge pump circuit comprises:
a first switch;
a second switch;
a first proportional resistor;
a second proportional resistor;
a load resistor;
and a ripple capacitor,
wherein the first switch and the first proportional resistor are serially connected between a first power supply node and the output node of the charge pump circuit,
wherein the second proportional resistor and the second switch are serially connected between the output node and a second power supply node,
wherein the load resistor is connected between a third power supply node and the output node,
wherein the ripple capacitor is connected between the third power supply node and the output node, and
wherein a common voltage is applied to the third power supply node.

11. A phase locked loop (PLL) circuit, comprising:
a first phase and frequency detector (PFD), which compares a reference clock signal and a first feedback clock signal to determine a frequency difference between the reference and first feedback clock signals, and which generates a first control signal that indicates a frequency difference between the reference and first feedback clock signals;
a second PFD which compares the reference clock signal and the first feedback clock signal to determine a phase difference between the reference and first feedback clock signals, and which generates a second control signal that indicates a phase difference between the reference and first feedback clock signals;
a digitally controlled oscillator (DCO) that generates an output signal having a target frequency;
a digital integrating control path that is responsive to the first control signal output from the first PFD to generate a first DCO control signal to adjust a frequency of the output signal of the DCO to the target frequency;
an analog proportional control path that is responsive to the second control signal output from the second PFD to generate a second DCO control signal to adjust a phase of the output signal of the DCO; and
a feedback circuit to generate the first feedback clock signal based on the output signal from the DCO,
wherein the analog proportional control path comprises a charge pump circuit that is responsive to the second control signal to adjust an analog proportional control voltage on an output node of the charge pump circuit, wherein the charge pump circuit comprises:
a first switch;
a second switch;
a first proportional resistor;
a second proportional resistor;
a load resistor;
and a ripple capacitor,
wherein the first switch and the first proportional resistor are serially connected between a first power supply node and the output node of the charge pump circuit,
wherein the second proportional resistor and the second switch are serially connected between the output node and a second power supply node,
wherein the load resistor is connected between a third power supply node and the output node,
wherein the ripple capacitor is connected between the third power supply node and the output node, and
wherein a common voltage is applied to the third power supply node.

12. The PLL circuit of claim 11, wherein the digital integrating control path comprises:
a digital integrator that receives the first control signal output from the PFD;
a first sigma-delta modulator connected to an output of the digital integrator circuit;
a second sigma-delta modulator connected to an output of the first sigma delta modulator;

wherein the digital integrator and the first sigma-delta modulator operate using the first feedback clock signal generated by the feedback circuit, wherein the second sigma-delta modulator operates using a second feedback clock signal generated by the feedback circuit, wherein the second feedback clock signal has a frequency that is greater than a frequency of the first feedback clock signal.

13. The PLL circuit of claim 12, wherein the digital integrating control path further comprises an RC filter network connected between an output of the second sigma-delta modulator and a dithering input control port of the DCO.

14. The PLL circuit of claim 12, wherein the digital integrating control path further comprises a band control circuit connected to a second output of the digital integrator, wherein the band control circuit is responsive to control signal output from the digital integrator to generate a second DCO control signal to adjust a frequency of the output signal of the DCO to the target frequency.

15. The PLL circuit of claim 11, wherein the digital integrating control path comprises:

a digital integrator that receives the first control signal output from the PFD;

a sigma-delta modulator connected to an output of the digital integrator circuit; and an RC filter network connected between an output of the sigma-delta modulator and a dithering input control port of the DCO, wherein the digital integrator operates using the first feedback clock signal generated by the feedback circuit, and wherein the sigma-delta modulator operates using a second feedback clock signal generated by the feedback circuit, wherein the second feedback clock signal has a frequency that is greater than a frequency of the first feedback clock signal.

16. The PLL circuit of claim 15, wherein the digital integrating control path further comprises a band control circuit connected to a second output of the digital integrator, wherein the band control circuit is responsive to control signal output from the digital integrator to generate a second DCO control signal to adjust a frequency of the output signal of the DCO to the target frequency.

* * * * *